United States Patent [19]

Spires

[11] 4,454,479
[45] Jun. 12, 1984

[54] OPERATIONAL AMPLIFIER WITH IMPROVED OUTPUT CAPABILITY

[75] Inventor: Dewayne A. Spires, Plaistow, N.H.

[73] Assignee: Bell Telephone Laboratories, Incorporated, Murray Hill, N.J.

[21] Appl. No.: 451,024

[22] Filed: Dec. 20, 1982

[51] Int. Cl.³ .......................... H03F 3/18; H03F 3/26
[52] U.S. Cl. .................................... 330/263; 330/265; 330/267
[58] Field of Search ............... 330/263, 265, 267, 268, 330/288, 255

[56] References Cited

U.S. PATENT DOCUMENTS 3,723,896   3/1973   Flickinger ........................... 330/255
4,404,528   9/1983   Yamaguchi ..................... 330/263 X

OTHER PUBLICATIONS

"Fast Slewing Monolithic Operational Amplifier", by W. E. Hearn, *IEEE Journal of Solid-State Circuits*, vol. SC-6, No. 1, Feb. 1971, pp. 20–24.

"Transistor Circuit Engineering", by R. F. Shea, John Wiley & Sons, Inc., 1957, pp. 130–131.

*Primary Examiner*—James B. Mullins
*Assistant Examiner*—Steven J. Mottola
*Attorney, Agent, or Firm*—John K. Mullarney

[57] ABSTRACT

The disclosed operational amplifier comprises a first pair of complementary type transistors (Q5, Q6) (of high current carrying capacity) that have their emitter-collector paths connected in series across a source of reference potential. The emitters of the transistors are connected together and to an output terminal (17). A second pair of complementary type transistors (Q3, Q4) are coupled across said reference potential, each transistor of said second pair being coupled across the similar conductivity type transistor of said first pair. A first pair of resistances (R1, R2) of predetermined value are respectively connected between the bases of the similar conductivity type transistors of said first and second pair. A second pair of resistances (R3, R4) respectively connect the emitters of the transistors of said second pair to said output terminal. Each of said second pair of resistances has a value substantially equal to said predetermined value plus the intrinsic base resistance of the transistors of the first pair. A pair of current mirror circuits (Q11, Q13, and Q12, Q14) are respectively coupled from the collectors of said second pair of transistors to the bases of the similar conductivity type transistors of said first pair to provide the additional base drive required by the first pair of transistors for large current output therefrom.

6 Claims, 1 Drawing Figure

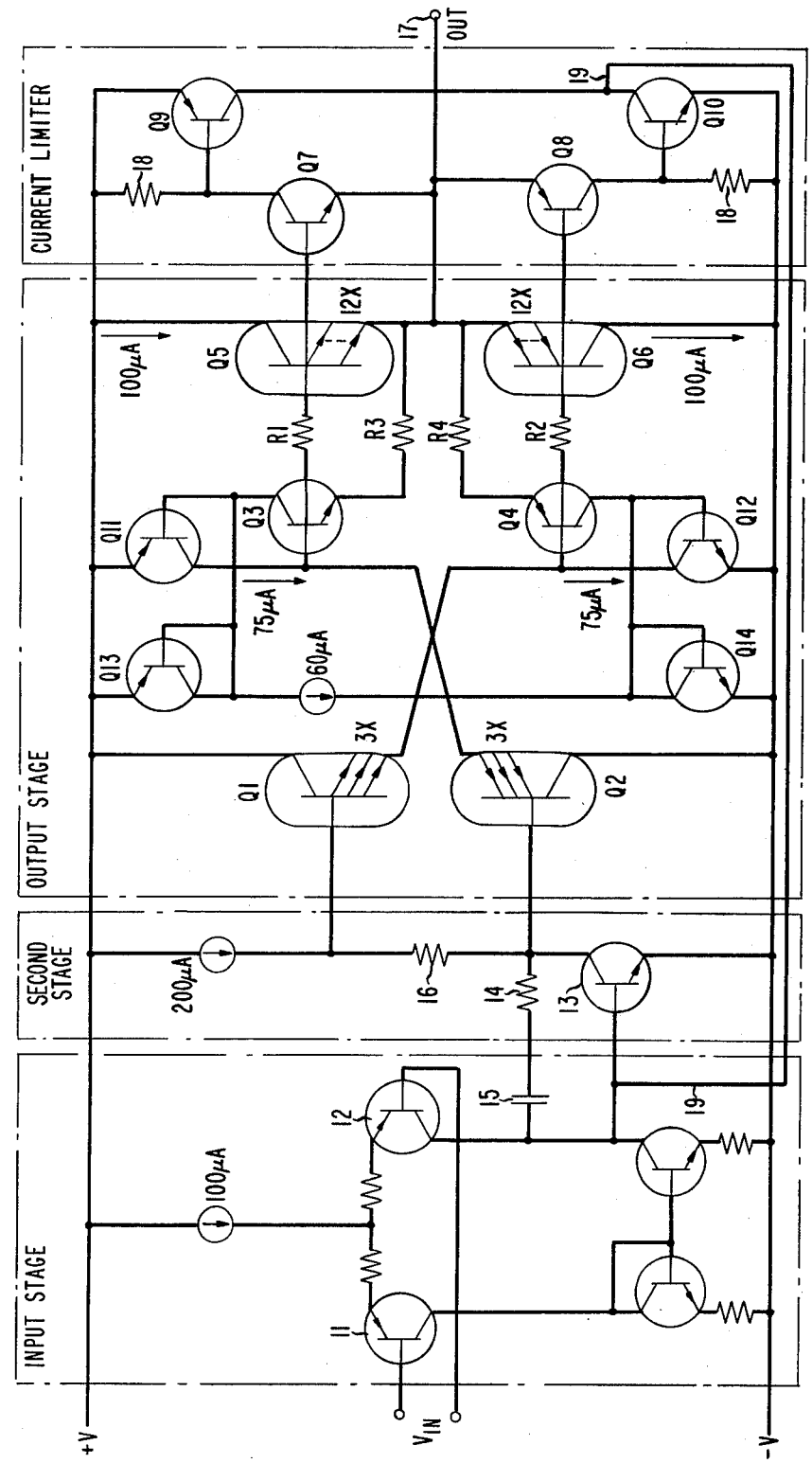

OPERATIONAL AMPLIFIER WITH IMPROVED OUTPUT CAPABILITY

TECHNICAL FIELD

The present invention relates to an operational amplifier that has a maximum output swing with large output current capability and low quiescent power dissipation.

BACKGROUND OF THE INVENTION

Prior art amplifier designs provide either maximum output voltage swing or high output current capability, but not both. A Darlington configured amplifier stage accomplishes high current capability with low power dissipation, but it reduces the output swing by two $V_{be}$. This is significant when the amplifier is being used on low power supplies (e.g., ±5 V). An up-down, or cross-coupled, amplifier circuit accomplishes a maximum output voltage swing, but the output stage of the amplifier must be operated at a quiescent current equal to the maximum output current divided by the minimum Beta of the output transistor(s). This increases the quiescent power dissipation of the amplifier. A Darlington connection is shown and described in the text "Transistor Circuit Engineering", by R. F. Shea, John Wiley and Sons, Inc. (1957) pp. 130–1; and, a typical prior art, cross-coupled amplifier is disclosed, for example, in FIG. 8 (Q27,Q29 and Q28,Q30) of an article by W. E. Hearn entitled "Fast Slewing Monolithic Operational Amplifier", IEEE Journal of Solid-State Circuits, Vol. SC-6, No. 1, February 1971, pp. 20–24.

SUMMARY OF THE INVENTION

An operational amplifier in accordance with the present invention comprises a first pair of complementary type transistors (of high current carrying capacity) that have their emitter-collector paths connected in series across a source of reference potential. The emitters of the transistors are connected together and to an output terminal. A second pair of complementary type transistors are coupled across said reference potential, each transistor of said second pair being coupled across the similar conductivity type transistor of said first pair. A first pair of resistances of predetermined value are respectively connected between the bases of the similar conductivity type transistors of said first and second pair. A second pair of resistances respectively connect the emitters of the transistors of said second pair to said output terminal. Each of said second pair of resistances has a value substantially equal to said predetermined value plus the intrinsic base resistance of the transistors of the first pair. A pair of current mirror circuits are respectively coupled from the collectors of said second pair of transistors to the bases of the similar conductivity type transistors of said first pair to provide the additional base drive required by the first pair of transistors for large current output therefrom.

Since the amplifier circuit described above has essentially infinite drive capability, and could destroy itself, it is a feature of the invention to limit the current output to a predetermined (high) value. To this end, a third pair of complementary type transistors are similarly connected across said reference potential, with the emitters thereof connected together and to said output terminal. The current carrying capacity of the transistors of said third pair is scaled (e.g., one twelfth) to that of the transistors of the first pair. When the collector current of either of said third pair of transistors reaches a predetermined value, a feedback circuit is enabled to reduce the base drive to said first pair of transistors.

BRIEF DESCRIPTION OF THE DRAWING

The single FIGURE is a detailed schematic diagram of an operational amplifier in accordance with the principles of the present invention.

DETAILED DESCRIPTION

Referring now to the drawing, an operational amplifier in accordance with the invention incorporates an input stage and a second stage that are more or less conventional in design. The differential input stage is used for power supply rejection. The input signal(s) $V_{IN}$ is coupled to the bases of transistors 11 and 12. Alternatively, of course, an input signal might be coupled to the base of transistor 11 with the base of transistor 12 grounded or vice versa. The output of this input stage is coupled to the second stage which comprises a transistor 13 connected in a common emitter configuration. A negative feedback path comprising resistance 14 and capacitance 15 provides added circuit stability. A constant current source (e.g., 200 μA) is connected in the emitter-collector path of transistor 13.

The output stage, designed in accordance with the invention, contains the circuitry for providing a large output voltage swing with high current drive capability and low quiescent power dissipation. The basic output circuit is a cross-coupled stage comprised of transistors Q1, Q2, Q5 and Q6 which is biased at approximately 100 μA in the output (Q5 and Q6) and 75 μA in the drivers (Q1 and Q2). The drivers Q1 and Q2 are each connected in an emitter follower configuration. The transistors Q1 and Q2 bear the designation 3×, which, as known to those in the art, is understood to mean that they have enlarged emitter areas (three times) to achieve a corresponding increase in current carrying capacity. The resistance 16 plays a part in establishing the desired low quiescent current flow (e.g., 100 μA) in output transistors Q5 and Q6 and is of a value of approximately 300 ohms.

The signal at the emitter of transistor Q1 is coupled to the base of output transistor Q6, and the signal at the emitter of transistor Q2 is delivered to the base of output transistor Q5. The transistors Q5 and Q6 are complementary type transistors (i.e., of opposite conductivity), with their emitter-collector paths connected in series across a source of reference potential (+V, −V). The emitters of transistors Q5 and Q6 are connected to each other and to the output terminal 17. The emitters of transistors Q5 and Q6 are scaled by a factor of twelve (12×) to achieve a corresponding increase in their current carrying capacity. It is to be understood, however, that the invention is in no way limited to the indicated scaling factors (3× for Q1, Q2 and 12× for Q5, Q6).

A second pair of complementary type transistors Q3 and Q4 are coupled across the source of reference potential, with each transistor of this second pair being coupled across the similar conductivity type transistor of the first pair. That is, the n-p-n transistor Q3 is effectively across the output n-p-n transistor Q5, and the p-n-p transistor Q4 is coupled across the p-n-p transistor Q6. A pair of resistances R1 and R2 of predetermined value (e.g., 50 ohms) are respectively connected between the bases of Q3, Q5 and Q4, Q6. Thus, the emitter of Q2, for example, is directly connected to the base of Q3, and also to the base of Q5 via resistance R1.

The collectors of transistors Q3 and Q4 are coupled to the source of reference potential (+V, −V) via the transistors Q13 and Q14, respectively. The transistors Q13 and Q14 are diode connected. A second pair of resistances R3 and R4 respectively connect the emitters of transistors Q3 and Q4 to the output terminal 17. Each of the resistances R3 and R4 has a value (e.g., 100 ohms) substantially equal to the value of resistances R1 and R2 (50 ohms) plus the intrinsic base resistance (about 50 ohms) of the transistors Q5 and Q6.

The base-emitter path of transistor Q11 is connected in shunt with that of Q13, and the base-emitter path of transistor Q12 in shunt with that of Q14. The collector of Q11 is connected to the bases of Q3 and Q5, and the collector of Q12 is connected to the bases of Q4 and Q6. The transistors Q11 and Q12 are chosen to match transistors Q13 and Q14. The $V_{be}$ of transistor Q11, for example, equals the $V_{be}$ of Q13 and therefore Q11 "mirrors" the current flow in the emitter-collector path of Q13; the $V_{be}$ is the voltage drop across the base-emitter junction.

The output amplifier circuit is a class AB amplifier. In class A, it will be recalled, both transistors are always active; in class B, each transistor (Q5, Q6) is active in alternative half cycles or alternate polarities of the input thereto; and in Class AB, the amplifier operates class A for small signals but class B for large signals.

The cross-coupled circuit (Q1, Q2, Q5, and Q6) alone would provide about Beta times 75 μA or only 7.5 mA of output current with Betas of 100. This, of course, may be adequate for small signals, but not for large signals. However, the circuitry added (Q3, Q4, Q11, Q12, Q13, Q14) in accordance with the invention serves to significantly enhance the output capability of the basic cross-coupled amplifier circuit.

For purposes of explanation, assume that transistor Q5 must deliver a large (positive) current to a load at the output of the amplifier. Because of the finite Beta of Q5, this causes increased current drive to the base of Q5 from emitter follower Q2 and results in a concomitant increased voltage drop across the resistance R1 and intrinsic base resistance ($R_b$) of Q5. As previously described, the resistance R3=(R1+$R_b$). Resistance R3 is also, in effect, in shunt with (R1+$R_b$). Accordingly, as the voltage across (R1+$R_b$) increases with increased drive current, it is necessary that the voltage across the shunt coupled resistance R3 increase to the same extent. This, in turn, necessitates a current flow through the emitter-collector path of transistor Q3 and, of course, through the diode-connected transistor Q13 in series therewith which is substantially equal to the base current of transistor Q5. (The effect of the intrinsic base resistance of Q3 is 1/Beta that of Q5 and hence can be disregarded.) This current is mirrored by transistor Q11 which provides exactly the additional base drive necessary for the output transistor Q5, regardless of the load on the amplifier. The operation can be thought of as somewhat similar to positive feedback; hence, there is theoretically no limit to the output current drive capability of the amplifier. This design has been shown to operate to over 100 mA of output current, which is high for the low quiescent current in the output stage. Further, the output stage can swing to within one $V_{be}$ plus a $V_{ce}$(SAT) of either supply. Since the $V_{ce}$ of Q11 at saturation (SAT) is small (e.g., 0.1–0.2 v), this is approximately one $V_{be}$ better than a Darlington output.

A large (negative) drive current delivered to transistor Q6 from the emitter follower Q1 produces a similar effect in the other half of the output stage comprised of transistors Q4, Q6, Q12 and Q14. The upper and lower halves of the output stage are really mirror images of each other, with the upper half providing the high current drive capability for large positive signals and the lower half doing the same for large negative signals.

Since the output stage has essentially infinite drive capability and might destroy itself, a current limiter in accordance with the invention is used to limit the output current to a predetermined (high) value. To this end, a third pair of complementary transistors Q7 and Q8 are similarly connected across the source of reference potential. The emitters of Q7 and Q8 are connected together and to the output terminal 17. A pair of sense resistances 18 are connected in the collector paths of Q7 and Q8. These sense resistances are connected across the base-emitters of transistor Q9 and Q10; and, the collectors of Q9 and Q10 are connected together and via the feedback path 19 to the base of transistor Q13. The transistors Q7 and Q8 are (emitter) scaled to Q5 and Q6 such that the current through Q7, for example, will be about 1/12 that of Q5. As the current through Q5 increases so does the current through transistor Q7. Increased current flow in the collector path of Q7 causes an increased voltage drop across the resistance 18. At some predetermined point, depending upon the value of resistance(s) 18, the voltage drop across the resistance 18 is such that the normally off transistor Q9 will turn on. Increasing conduction of transistor Q9 tends to overdrive or even saturate the transistor 13 causing its collector to go toward the −V supply. This result is conveyed to the base of Q5, via the emitter follower Q2, and as a consequence the current flow through transistor Q5 will be reduced or limited.

The transistors Q8 and Q10 operate in a similar fashion to limit the current output of transistor Q6 to a predetermined high value. The upper and lower halves of the current limiter stage are really mirror images of each other, with the upper half providing the current limiting function for a large positive output current and the lower half doing the same for large negative signals.

The transistor types shown in the schematic drawing are merely by way of illustration, it being clear to those in the art that p-n-p transistors can generally be substituted for n-p-n transistors and vice versa with due regard, of course, to the polarities of the reference source(s). Further, the amplifier circuit in accordance with the invention can be readily fabricated in integrated circuit form. It is to be understood, therefore, that the foregoing disclosure results to only a preferred embodiment of the invention and that numerous modifications or alterations may be made therein without departing from the spirit and scope of the invention.

What is claimed is:

1. An operational amplifier comprising a first pair of complementary type transistors (Q5, Q6) having their emitter-collector paths connected in series across a source of reference potential, the emitters of said transistors being connected to each other and to an output terminal (17), a second pair of complementary type transistors (Q3, Q4) being coupled across said reference potential, each transistor of said second pair being coupled across the similar conductivity type transistor of said first pair, a first pair of resistances (R1, R2) of predetermined value being respectively connected between the bases of the similar conductivity type transistors of said first and second pair, a second pair of resistances (R3, R4) being respectively connected between the emitters of the transistors of said second pair and said output terminal, each of said second pair of resistances having a value substantially equal to said predetermined value plus the intrinsic base resistance of the transistors of the first pair, and a pair of current mirror means (Q11, Q13, and Q12, Q14) being respectively coupled from the collectors of said second pair of transistors to the bases of the similar conductivity type transistors of said first pair to provide additional base drive to the first pair of transistors to achieve large current outputs therefrom.

2. An operational amplifier as defined in claim 1 including means (Q7-Q10) coupled across the source of reference potential and to said output terminal to limit the current output to a predetermined high value.

3. An operational amplifier as defined in claim 2 wherein said first pair of transistors have emitter areas that are enlarged by a predetermined scale factor.

4. An operational amplifier as defined in claim 3 wherein said scale factor is substantially equal to 12.

5. An operational amplifier as defined in claim 3 including a pair of emitter follower drivers (Q1, Q2) connected in a cross-coupled configuration to the bases of said first pair of transistors.

6. An operational amplifier as defined in claim 5 wherein the current limiting means comprises a third pair of complementary type transistors (Q7, Q8) similarly connected across said reference potential with the emitters thereof connected together and to said output terminal, and feedback means (Q9, Q10, 19, 13) coupled from the collectors of said third pair of transistors to the input to said emitter followers to reduce the base drive to said first pair of transistors when the collector current of either of said third pair of transistors reaches a predetermined value.

* * * * *